United States Patent
Malekpour

(10) Patent No.: US 8,255,732 B2
(45) Date of Patent: Aug. 28, 2012

(54) SELF-STABILIZING BYZANTINE-FAULT-TOLERANT CLOCK SYNCHRONIZATION SYSTEM AND METHOD

(75) Inventor: Mahyar R. Malekpour, Hampton, VA (US)

(73) Assignee: The United States of America, as represented by the Administrator of the National Aeronautics and Space Administration, Washington, DC (US)

(*) Notice: Subject to any disclaimer, the term of this patent is extended or adjusted under 35 U.S.C. 154(b) by 615 days.

(21) Appl. No.: 12/429,603

(22) Filed: Apr. 24, 2009

(65) Prior Publication Data

US 2010/0019811 A1   Jan. 28, 2010

Related U.S. Application Data

(60) Provisional application No. 61/056,537, filed on May 28, 2008.

(51) Int. Cl.
*G06F 1/12* (2006.01)
*G06F 1/04* (2006.01)
*G06F 15/16* (2006.01)

(52) U.S. Cl. .................. 713/400; 713/375; 709/248
(58) Field of Classification Search .................. None
See application file for complete search history.

(56) References Cited

U.S. PATENT DOCUMENTS

| | | | |
|---|---|---|---|
| 4,866,606 A | 9/1989 | Kopetz | |
| 4,979,191 A | 12/1990 | Bond et al. | |
| 4,984,241 A | 1/1991 | Truong | |
| 5,041,966 A * | 8/1991 | Nakai et al. | ................ 713/375 |
| 5,249,206 A | 9/1993 | Appelbaum et al. | |
| 5,295,257 A | 3/1994 | Berkovich et al. | |
| 5,377,205 A | 12/1994 | Shi | |
| 5,377,206 A | 12/1994 | Smith | |
| 5,557,623 A | 9/1996 | Discoll | |
| 5,600,784 A | 2/1997 | Bissett et al. | |
| 5,907,685 A | 5/1999 | Douceur | |
| 5,956,474 A | 9/1999 | Bissett et al. | |
| 5,964,846 A | 10/1999 | Berry et al. | |
| 6,178,522 B1 | 1/2001 | Zhou et al. | |
| 6,349,391 B1 | 2/2002 | Petnan et al. | |
| 6,567,927 B1 | 5/2003 | Brinkmann | |
| 6,671,821 B1 | 12/2003 | Castro et al. | |
| 7,023,884 B2 | 4/2006 | Chuah et al. | |
| 7,124,316 B2 | 10/2006 | Kopetz et al. | |
| 7,257,133 B2 | 8/2007 | Jeske et al. | |

(Continued)

OTHER PUBLICATIONS

Mahyar R. Malekpour, "A Self-Stabilizing Byzantine-Fault-Tolerant Clock Synchronization Protocol", NASA LaRC Abstract, May 23, 2008, pp. 1-14.

(Continued)

*Primary Examiner* — Ji H Bae
(74) *Attorney, Agent, or Firm* — Andrea Z. Warmbier; Helen M. Galus

(57) ABSTRACT

Systems and methods for rapid Byzantine-fault-tolerant self-stabilizing clock synchronization are provided. The systems and methods are based on a protocol comprising a state machine and a set of monitors that execute once every local oscillator tick. The protocol is independent of specific application specific requirements. The faults are assumed to be arbitrary and/or malicious. All timing measures of variables are based on the node's local clock and thus no central clock or externally generated pulse is used. Instances of the protocol are shown to tolerate bursts of transient failures and deterministically converge with a linear convergence time with respect to the synchronization period as predicted.

34 Claims, 6 Drawing Sheets

U.S. PATENT DOCUMENTS

| | | | |
|---|---|---|---|
| 7,260,652 B2 | 8/2007 | Fuehrer et al. | |
| 7,263,630 B2 | 8/2007 | Sailer | |
| 7,328,235 B2 | 2/2008 | Mori et al. | |
| 7,509,513 B2 * | 3/2009 | Toillon et al. | 713/375 |
| 7,792,015 B2 * | 9/2010 | Malekpour | 370/216 |
| 7,912,094 B2 * | 3/2011 | Hall et al. | 370/508 |
| 7,991,101 B2 * | 8/2011 | Kocaman et al. | 375/359 |
| 2002/0129087 A1 | 9/2002 | Cachin et al. | |
| 2004/0205372 A1 | 10/2004 | Moser et al. | |
| 2005/0089131 A1 | 4/2005 | Howell et al. | |
| 2006/0109868 A1 | 5/2006 | Schopp | |

OTHER PUBLICATIONS

Mahyar R. Malekpour, "A Self-Stabilizing Byzantine-Fault-Tolerant Clock Synchronization Protocol", NASA LaRC Abstract, Nov. 28, 2007, pp. 1-14.

Mahyar R. Malekpour, "A Self-Stabilizing Byzantine-Fault-Tolerant Clock Synchronization Protocol", NASA TM-2008, Jan. 2008, pp. 1-42.

H. Koptez. "Real-Time Systems. Design Principles for Distributed Embedded Applications," 1997, p. 47 Kluwer Academic Publishers, United States of America.

* cited by examiner

SELF-STABILIZING BYZANTINE-FAULT-TOLERANT CLOCK SYNCHRONIZATION SYSTEM AND METHOD

CROSS-REFERENCE TO RELATED APPLICATIONS

This application claims the benefit of the filing date of U.S. Provisional Patent Application Ser. No. 61/056,537 filed May 28, 2008, the entire disclosure of which is incorporated herein by reference.

ORIGIN OF THE INVENTION

The invention was made in part by employees of the United States Government and may be manufactured and used by or for the Government of the United States of America for governmental purposes without the payment of any royalties thereon or therefor.

BACKGROUND OF THE INVENTION

1. Field of the Invention

The present invention is in the field of real-time systems and more particularly concerns systems and methods for synchronizing clocks among a plurality of distributed nodes in a manner that is capable of reliably self-stabilizing even in the presence of nodes exhibiting arbitrary Byzantine fault-prone behavior.

2. Description of the Related Art

A major problem in operating with any distributed system is establishing a consistent global view of the system from the local perspective of the participants. A basic aspect of arriving at such consistency is the ability to synchronize clocks, Numerous methods have been devised for clock synchronization, and for achieving convergence in resynchronization. The worst case scenario for synchronization is where the nodes to be synchronized are subject to "Byzantine" faults— that is, where distributed systems experience arbitrary and/or malicious faults during the execution of algorithms, including, among others, "send and omission failures". See generally H. Kopetz, "Real-Time Systems, Design Principles for Distributed embedded Applications" (Kluwer Academic Publishers, 1997) (hereinafter "Kopetz 1997"). Known systems have not been able to guarantee convergence deterministically, scalably, and in a self-stabilizing manner in the presence of Byzantine faults, without limiting assumptions about initial states, use of a central clock, or relying on an externally-generated pulse system.

SUMMARY OF THE INVENTION

It is an object of the invention to provide systems and methods for synchronizing distributed clocks that self-stabilize from any state; do not rely on any assumptions about the initial state of the clocks, and do not require a central clock or an externally-generated pulse system, but which converge deterministically; are scalable; and/or self-stabilize in a short amount of time, even with the inclusion of nodes exhibiting Byzantine faults.

It is a further object of the invention to provide systems and methods for rapid Byzantine-fault-tolerant synchronization that tolerates bursts of transient failures, and deterministically converges with a linear convergence time with respect to the self-stabilization period.

It is another object of the invention to provide systems and methods for rapid Byzantine-fault-tolerant synchronization that are scalable with respect to the fundamental parameters of number of nodes (K), minimum event-response delay (D) and network imprecision (d).

In at least one embodiment, the foregoing objects are achieved by the use, in systems and methods for distributed clock synchronization, of a protocol comprising a state machine and a set of monitors that execute once every local oscillator tick. This protocol is independent of application-specific requirements and, thus, is focused only on clock synchronization of a system in the presence of Byzantine faults and after the cause of transient faults has dissipated. Instances of the protocol are proven to tolerate bursts of transient failures and deterministically converge with a linear convergence time with respect to the synchronization period as predicted. This protocol does not rely on any assumptions about the initial state of the system and no assumptions are made about the internal status of the nodes, the monitors, and the system as a whole) thus making the weakest assumptions and, therefore, producing the strongest results. All timing measures of variables are based on the node's local clock and thus no central clock or externally generated pulse is used. The Byzantine faulty behavior modeled here is a node with arbitrary and/or malicious behavior. The Byzantine faulty node is allowed to influence other nodes at every clock tick and at all times. The only constraint is that the interactions are restricted to defined interfaces.

Other aspects and advantages of the invention will be apparent from the accompanying drawings, and the detailed description that follows.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF PREFERRED EMBODIMENTS

Figure 1:
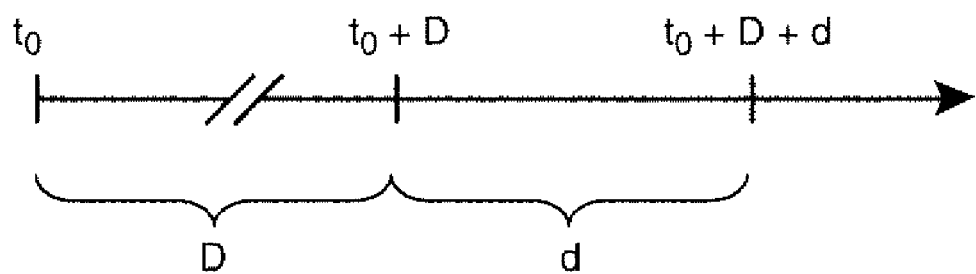
FIG. 1 is a timeline depiction of event response delay and network imprecision.

The following is a detailed description of certain embodiments of the invention chosen to provide illustrative examples of how it may advantageously be implemented. The scope of the invention is not limited to the specific embodiments described, nor is it limited by any specific implementation, composition, embodiment or characterization depicted in the accompanying drawings or stated or described in the invention summary or the abstract. In addition, it should be noted that this disclosure describes a number of methods that each comprise a plurality of steps. Nothing contained in this written description should be understood to imply any necessary order of steps in such methods, other than as specified by express claim language.

1. System Description

The present disclosure is primarily directed at one advantageous embodiment, with a number of suggested alternatives and extensions. In this advantageous embodiment, the underlying topology considered is a network of K>3F+1 nodes that communicate by exchanging messages through a set of communication channels. A maximum of F Byzantine faulty nodes are assumed to be present in the system, where F>0. The Byzantine nodes may be modeled as nodes with arbitrary and/or malicious behavior that may influence other nodes at every clock tick and at all times, The communication channels are assumed to connect a set of source nodes to a set of destination nodes such that the source of a given message is distinctly identifiable from other sources of messages, The minimum number of good nodes in the system, G, is given by G=K−F nodes. Let $K_G$ represent the set of good nodes. The nodes communicate with each other by exchanging broadcast messages. Broadcast of a message to all other nodes is realized by transmitting the message to all other nodes at the same time. The source of a message is assumed to be uniquely identifiable. The communication network does not guarantee any relative order of arrival of a broadcast message at the receiving nodes. To paraphrase Kopetz [Kopetz 1997], a consistent delivery order of a set of messages does not necessarily reflect the temporal or causal order of the events.

The symbols used herein are defined as they are introduced. In addition, a table briefly describing each symbol is provided at the end of this disclosure.

Each node is driven by an independent local physical oscillator. The oscillators of good nodes have a known bounded drift rate, $0 \leq \rho \ll 1$, with respect to real time. For the remainder of this disclosure, all references to time are with respect to the nominal tick, where $\rho=0$, and are simply referred to as clock ticks.

Each node has two primary logical time clocks, StateTimer and LocalTimer, which locally keep track of the passage of time as indicated by the physical oscillator. In the context of this disclosure, all references to clock synchronization and self-stabilization of the system are with respect to the StateTimer and the LocalTimer of the nodes. There is neither a central clock nor an externally generated global pulse. The communication channels and the nodes can behave arbitrarily, provided that eventually the system adheres to the system assumptions (see Section 2.5 below).

FIG. 1 is a time line showing event-response delay, D, and network imprecision, d. The latency of interdependent communications between the nodes is expressed in terms of the minimum event-response delay, D, and network imprecision, d. As depicted in FIG. 1, a message transmitted by node $N_i$ at real time $t_0$ is expected to arrive at all destination nodes $N_j$, be processed, and subsequent messages generated by $N_j$ within the time interval of $[t_0+D, t_0+D+d]$ for all $N_j \in K_G$. Communication between independently clocked nodes is inherently imprecise. The network imprecision, d, is the maximum time difference between all good receivers, $N_j$, of a message from $N_i$ with respect to real time. The imprecision is due to the drift of the clocks with respect to real time, jitter, discretization error, temperature effects and differences in the lengths of the physical communication medium. These two parameters are assumed to be bounded such that $D \geq 1$ and $d \geq 0$ and both have values with units of real time nominal tick.

1.1 Gamma (γ)

The time line is partitioned into a sequence of equally-spaced intervals measured by the local oscillator since the node transitioned into another state. Such an interval, γ, is expressed in terms of the minimum event-response delay, D, and network imprecision, d, and is constrained such that $\gamma \geq (D+d)$, and is one or more local clock ticks. Therefore, the time-driven activities take place at equally-spaced intervals measured by the local oscillator since the node entered a new state. Unless stated otherwise, all time-dependent parameters of this protocol are measured locally and expressed as functions of γ. In contrast, the event-driven activities are independent of γ and, thus, take place immediately.

2. Protocol Description

When the system is stabilized, it is said to be in the steady state. In order to achieve self-stabilization, the nodes communicate by exchanging a self-stabilization message labeled Sync. The Sync message is transmitted either as a result of a resynchronization timeout, or when a node determines that sufficient number of other nodes have engaged in the resynchronization process.

Four fundamental parameters characterize the self-stabilization protocol, namely the topology, K, D, and d. The maximum number of faulty nodes, F, the minimum number of good nodes, G and the remaining parameters that are subsequently presented are derived parameters and are based on these fundamental parameters. One such derived parameter is γ, and another is $T_R$, which is used as a threshold in connection with the Sync messages.

2.1 Message Validity

Since only one self-stabilization message) namely Sync, is required for the proper operation of this protocol, a single binary value is sufficient to represent it. As a result, receiving such a message is indicative of its validity in the value domain. The protocol works when the timing requirements of the received messages from all good nodes at all other good nodes are not violated. The time interval between any two consecutive Sync messages from a node is denoted by $\Delta_{SS}$, and the shortest such interval is denoted by $\Delta_{SS,min}$. At the receiving nodes, the following definitions hold:

A Sync message from a given source is valid if it arrives at or after $\Delta_{SS,min}$ of its previous valid Sync message.

While in the Maintain state, a Sync message from a given source remains valid for the duration of that state.

While in the Restore state, a Sync message from a given source remains valid for the duration of one γ.

2.2 The Monitor

Figure 2:
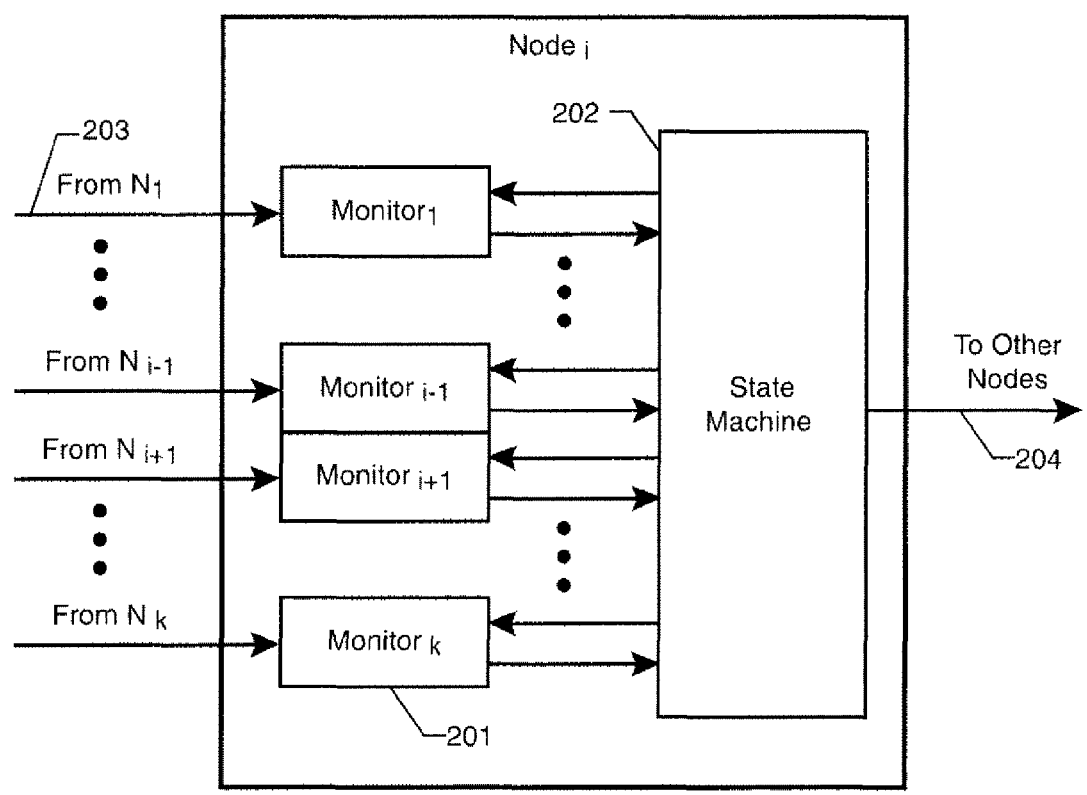
FIG. 2 is a block diagram for a node in accordance with one embodiment of the invention, showing its monitors and state machine.

In one embodiment, each node has a set of monitors and a state machine. FIG. 2 is a block diagram showing $i^{th}$ node, $N_i$, with its monitors 201 etc. and state machine 202 (discussed in Section 2.3 below). Inputs 203 etc. come from other nodes, to each monitor, and output 204 goes to other nodes via broadcast.

The messages to be delivered to the destination nodes are deposited on communication channels. To closely observe the behavior of other nodes, a node employs (K−1) monitors, one monitor for each source of incoming messages as shown in FIG. 2. A node neither uses nor monitors its own messages. The distributed observation of other nodes localizes error detection of incoming messages to their corresponding monitors, and allows for modularization and distribution of the self-stabilization protocol process within a node. A monitor keeps track of the activities of its corresponding source node. Specifically, a monitor reads, evaluates, time stamps, validates, and stores only the last valid message it receives from that node. A monitor maintains a logical timer, MessageTimer, by incrementing it once per local clock tick. This timer is reset upon receiving a valid Sync message. A monitor also disposes retained valid messages as appropriate.

2.3 The State Machine

Figure 3:
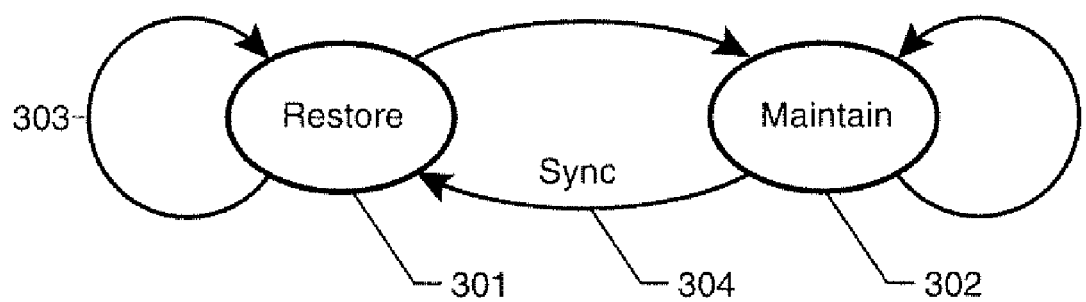
FIG. 3 is a state machine diagram of an exemplary node state machine.

FIG. 3 is a state transition diagram showing the node state machine. There are two states, Restore state 301 and Maintain state 302. Edge 303 relates to when a Sync message received in the Restore state (the system stays in the Restore state as explained below, because transition out of the Restore state depends on meeting "transitory conditions"). Edge 304 is the transition from the Maintain state to the Restore state, showing a Sync message being sent in that event (as explained below).

The assessment results of the monitored nodes are utilized by the node in the self-stabilization process. The node comprises a state machine and a set of (K−1) monitors. The state machine has two states, Restore (R) and Maintain (M), that reflect the current state of the node in the system as shown in FIG. 3. The state machine describes the behavior of the node, $N_i$, utilizing assessment results from its monitors, $M_1 \ldots M_{i-1}, M_{i+1} \ldots M_K$ as shown in FIG. 2, where $M_j$ is the monitor for the corresponding node $N_i$. In addition to the behavior of its corresponding source node, a monitor's internal status is influenced by the current state of the node's state machine. When the state machine transitions to the Restore state the monitors update their internal status as appropriate.

The transitory conditions enable the node to migrate from the Restore state to the Maintain state. Although during the self-stabilization process a node may also transition from the Restore state to the Maintain state upon a timeout, during steady state, such a time-out is indicative of an abnormal behavior. Therefore, the transitory conditions are defined with respect to the steady state where such time-outs do not occur. The transitory delay is the length of time a node stays in the Restore state. The minimum required duration for the transitory delay is denoted by $TD_{min}$ and the maximum duration of the transitory delay by $TD_{max}$. The $TD_{min}$ is a derived parameter and a function of F. For the fully connected topology considered here, the transitory conditions are defined as follows.

1. The node has remained in the Restore state for at least $TD_{min}$ since it entered the Restore state, where
   $TD_{min}=2$, for F=0, or
   $TD_{min}=2F$, for F>0, and
2. One γ has passed since the arrival of the last validSync message.

The maximum duration of the transitory delay, $TD_{max}$, is dependent on the number of additional valid Sync messages received and the drift rate ρ. The upper bound for $TD_{max}$ during steady state is given by $TD_{max}=\Delta_{Precision}+(F+2)\cdot\gamma$, where $\Delta_{Precision}$, also referred to as synchronization precision, is the guaranteed upper bound on the maximum separation between the LocalTimers of any two good nodes.

In the Restore state, the node will either meet the transitory conditions and transition to the Maintain state, or remain in the Restore state for a predetermined maximum duration until it times out and then transition to the Maintain state. In the Maintain state, a node will either remain in the Maintain state for a predetermined maximum duration until it times out and transitions to the Restore state, or transition to the Restore state when $T_R$ other nodes have transitioned out of the Maintain state. The node transmits a Sync message when transitioning to the Restore state.

Figure 4:
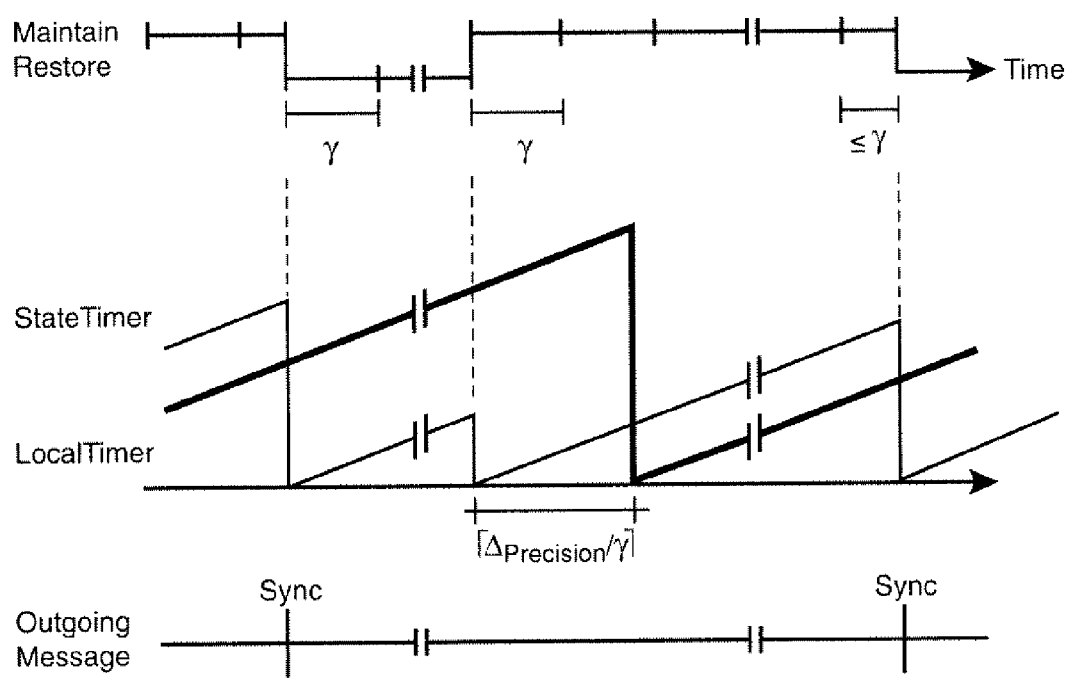
FIG. 4 is a timeline depiction of the activities of a good node during steady state.

In FIG. 4 the transitions of a good node to the Restore state and then from the Restore state to the Maintain state (during steady state) are depicted along a timeline of activities of the node. A Sync message is transmitted as the node transitions from the Restore state to the Maintain state. Activities of the StateTimer and LocalTimer of the node as it transitions between different states are also depicted in this figure.

Due to the inherent drift of the clocks of the good nodes, they need to be periodically resynchronized even if they start in perfect synchrony with respect to each other. The periodic synchronization during steady state is referred to as the resynchronization process, whereby all good nodes transition to the Restore state and then synchronously to the Maintain state. The resynchronization process begins when the first good node transitions to the Restore state and ends after the last good node transitions to the Maintain state.

The synchronization period is defined as the maximum time interval (during steady state) that a good node engages in the resynchronization process. The synchronization period depends on the maximum durations of both states of the node's state machine. The maximum duration for the Restore state is denoted by $P_R$, and the maximum duration for the Maintain state is denoted by $P_M$, where $P_R$ and $P_M$ are expressed in terms of γ. The length of time a good node stays in the Restore state is denoted by $L_R$. During steady state $L_R$ is always less than $P_R$. The length of time a good node stays in the Maintain state is denoted by $L_M$. The effective synchronization period, $P_{Actual}$, is the time interval (during steady state) between the last two consecutive resets of the LocalTimer of a good node in a stabilized system, where $P_{Actual}=L_R+L_M<P_R+P_M$.

The time interval between any two consecutive Sync messages from a node is denoted by $\Delta_{SS}$. The shortest such interval is denoted by $\Delta_{SS,min}$, and it follows that $\Delta_{SS,min}=(TD_{min}\cdot\gamma+1)$ clock ticks.

A node keeps track of time by incrementing its logical time clock StateTimer once every γ. After the StateTimer reaches $P_R$ or $P_M$ depending on the current state of the node, the node times out, resets the StateTimer, and transitions to the other state. If the node was in the Maintain state it transmits a new Sync message, The current value of this timer reflects the duration of the current state of the node.

This protocol does not maintain a history of past behavior of the nodes. All such determinations about the health status of the nodes in the system are assumed to be done by higher level mechanisms.

This protocol is expected to be used as the fundamental mechanism in bringing and maintaining a system within a known synchronization precision bound. Therefore, the protocol has to properly filter out inherent oscillations in the StateTimer during the resynchronization process as depicted in FIG. 4. This issue is resolved by using the LocalTimer in the protocol. The logical time clock LocalTimer is incremented once every local clock tick and is reset either when it reaches its maximum allowed value or when the node has transitioned to the Maintain state and remained in that state for ResetLocalTimerAt local clock ticks, where ResetLocalTimerAt is constrained by the following inequality:

$$\lceil\Delta_{Precision}/\gamma\rceil\leq \text{ResetLocalTimerAt}\leq P_M-\lceil\Delta_{Precision}/\gamma\rceil \qquad (1)$$

ResetLocalTimerAt can be given any value in its range as specified in inequality (1). However, its specific value must be the same at all good nodes. We chose the earliest such value, ResetLocalTimerAt=$\lceil\Delta_{Precision}/\gamma\rceil$, to reset the LocalTimer of all good nodes. Any value greater than $\lceil\Delta_{Precision}/\gamma\rceil$ will prolong the convergence time.

The LocalTimer is intended to be used by higher level protocols and must be managed properly to provide the desired behavior. The LocalTimer is also used in assessing the state of the system in the resynchronization process and is bounded by P, where $P=P_R+P_M$. During stead state, the value of LocalTimer is always less than P.

2.4 Protocol Functions

The functions used in this protocol are described in this section.

The function InvalidSync( ) is used by the monitors. This function determines whether a received Sync message is invalid. When this function returns a true value, it indicates that an unexpected behavior by the corresponding source node has been detected.

The function ConsumeMessage( ) is used by the monitors. When the host node is in the Restore state, the monitor invalidates the stored Sync message after it has been kept for $\gamma$.

The Retry( ) function determines if at least $T_R$ other nodes have transitioned out of the Maintain state, where $T_R=F+1$. When at least $T_R$ valid Sync messages from as many nodes have been received, this function returns a true value indicating that at least one good node has transitioned to the Restore state. This function is used to transition from the Maintain state to the Restore state.

The TransitoryConditionsMet( ) function determines proper timing of the transition from the Restore state to the Maintain state. This function keeps track of the passage of time by monitoring StateTimer and determines if the node has been in the Restore state for at least $TD_{min}$. It returns a true value when the transitory conditions are met.

The TimeOutRestore( ) function uses $P_R$ as a boundary value and asserts a timeout condition when the value of the StateTimer has reached $P_R$. Such timeout triggers the node to transition to the Maintain state.

The TimeOutMaintain( ) function uses $P_M$ as a boundary value and asserts a timeout condition when the value of the StateTimer has reached $P_M$. Such timeout triggers the node to reengage in another round of synchronization. This function is used when the node is in the Maintain state.

In addition to the above functions, the state machine utilizes the TimeoutGammaTimer( ) function. This function is used to regulate node activities at the $\gamma$ boundaries. It maintains a GammaTimer by incrementing it once per local clock tick and once it reaches the duration of $\gamma$, it is reset and the function returns a true value.

2.5 System Assumptions

The system assumptions are defined as follows.
1. The cause of transient faults has dissipated.
2. All good nodes actively participate in the self-stabilization process and correctly execute the protocol.
3. At most F of the nodes remain faulty.
4. The source of a message is distinctly identifiable by the receivers from other sources of messages.
5. A message sent by a good node will be received and processed by all other good nodes within $\gamma$, where $\gamma \geq (D+d)$.
6. The initial values of the state and all variables of a node can be set to any arbitrary value within their corresponding range. (In an implementation, it is expected that some local capabilities exist to enforce type consistency for all variables.)

2.6 The Self-Stabilizing Clock Synchronization Problem

To simplify the presentation of this protocol, it is assumed that all time references are with respect to an initial real time $t_0$, where $t_0=0$ when the system assumptions are satisfied, and for all $t>t_0$ the system operates within the system assumptions. Let C be the bound on the maximum convergence time, $\Delta_{LocalTimer}(t)$, for real time t, be the maximum difference of values of the local timers of any two good nodes $N_i$ and $N_j$, where $N_i, N_j \in K_G$, and $K_G$ is the set of all good nodes, and $\Delta_{Precision}$, also referred to as self-stabilization or synchronization precision, be the guaranteed upper bound on the maximum separation between the local timers of any two good nodes $N_i$ and $N_j$ in the presence of a maximum of F faulty nodes, where $N_i, N_j \in K_G$.

A good node $N_i$ resets its variable LocalTimer$_i$ periodically but at different points in time than other good nodes. The difference of local timers of all good nodes at time t, $\Delta_{LocalTimer}(t)$, is determined by the following equation while recognizing the variations in the values of the LocalTimer$_i$ across all good nodes.

$$\Delta_{LocalTimer}(t) = \min((LocalTimer_{max}(t) - LocalTimer_{min}(t)), (LocalTimer_{max}(t-r) - LocalTimer_{min}(t-r))),$$

where,
$r = \lceil \Delta_{Precision}/\gamma \rceil$,
$LocalTimer_{min}(x) = \min(LocalTimer_i(x))$,
$LocalTimer_{max}(x) = \max(LocalTimer_i(x))$, and
there exist C and $\Delta_{precision}$ such that:
1. Convergence: $\Delta_{LocalTimer}(t) \leq \Delta_{Precision}$
2. Closure: $\forall t \geq C, \Delta_{LocalTimer}(t) \leq \Delta_{Precision}$
3. Congruence: $\forall N_i, N_j \in K_G, \forall t \geq C, LocalTimer_i(t) = 0 \rightarrow N_i$ and $N_j$ are in the Maintain state.

The values of C, $\Delta_{Precision}$ (after an elapsed time of P), and the maximum value for LocalTimer$_i$, P, are determined to be:

$$C = (2P_R + P_M) \cdot \gamma$$

$$\Delta_{Precision} = (3F-1) \cdot \gamma - D + \Delta_{Drift},$$

$$P = P_R + P_M,$$

$$P_M >> P_R,$$

where the amount of drift from the initial precision is given by $$\Delta_{Drift}((1+\rho) - 1/(1+\rho))P \cdot \gamma.$$

Note that since $P > (\frac{1}{2})P_R$ and since the LocalTimer is reset after reaching P (worst case wraparound), a trivial solution is not possible.

3. A Self-Stabilizing Byzantine-Fault-Tolerant Clock Synchronization Protocol The presented protocol is described in FIG. 5 and comprises a state machine and a set of monitors that execute once every local oscillator tick.

Figure 5:
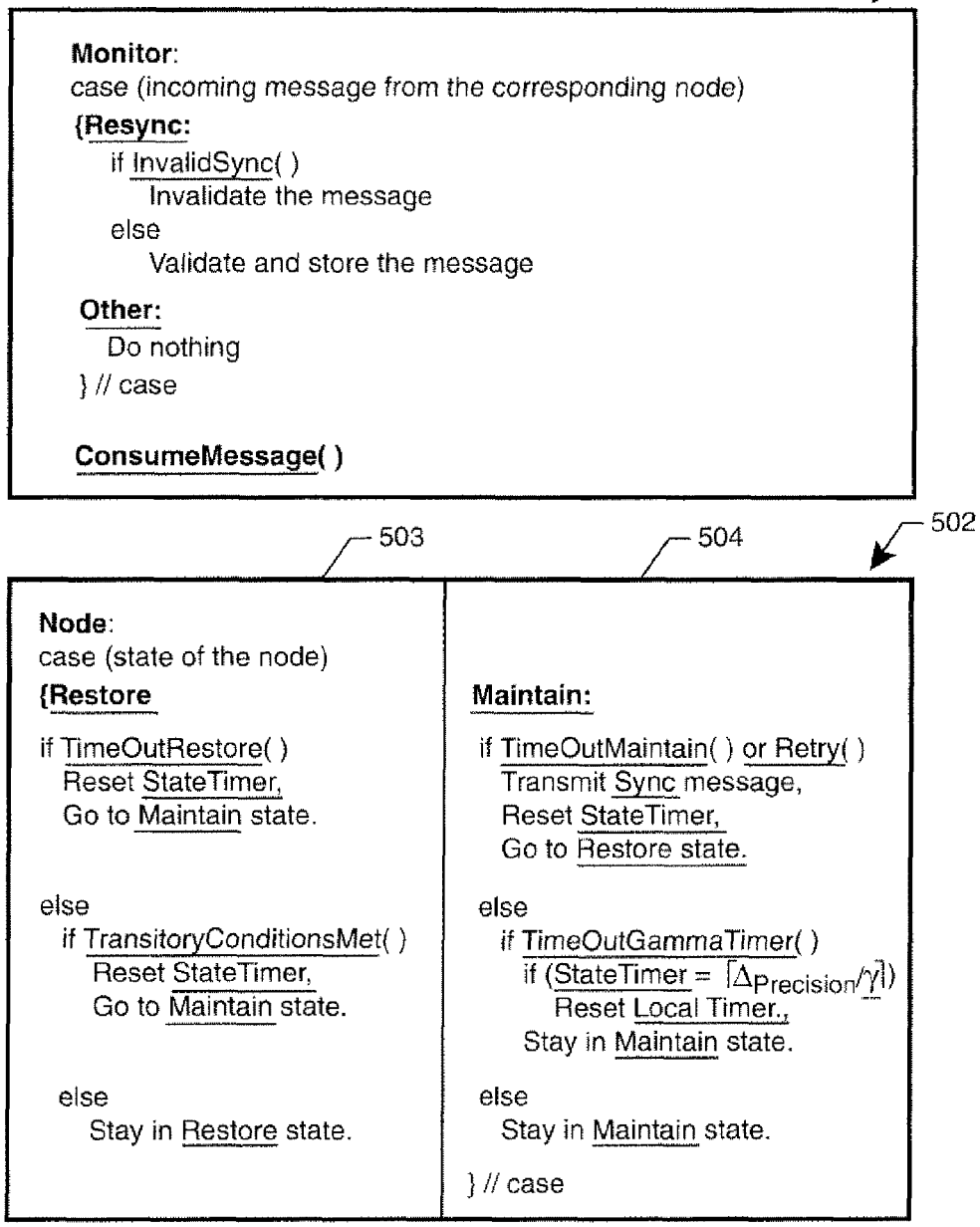
FIG. 5 shows three inter-related blocks of pseudocode, representing implementations of the components of a self-stabilization protocol in accordance with one embodiment of the invention.

The semantics of the pseudocode in FIG. 5 are as follows:
Indentation is used to show a block of sequential statements.
Commas (,) are used to separate sequential statements.
A period (.) is used to end a statement.
A period combined with a comma (.,) is used to mark the end of a statement and at the same time to separate it from other sequential statements.

The operational steps for each monitor 501 are:
1. if there is an incoming message from the node corresponding to the monitor:
    (a) determining if the message is a valid Sync message;
    (b) if the message is a valid Sync message, validating and storing the message;
    (c) if the message is not a valid Sync message, invalidating the message;
2. otherwise, if there is no such message, doing nothing With regard to the state machine 502, for the Restore state 503, the protocol steps are:
1. determining if the node has timed out in the Restore state;
2. if the node has timed out in the Restore state, resetting the StateTimer; and changing the machine state for the node to the Maintain state;
3. if the node has not timed out in the Restore state,
   determining if transitory conditions are met (i.e., that (a) the node has remained in the Restore state, since last entering that state, for a period equal to or greater than two StateTimer ticks, where the number of said faulty nodes is zero, or two times the number of faulty nodes, where the number of faulty nodes is greater than zero, and (b) a period of at least one γ has passed since the arrival of the last valid Sync message);
   if the transitory conditions are met,
      resetting the StateTimer;
      changing the machine state for the node to the Maintain state;
   if the transitory conditions are not met,
      keeping the machine state for the node in the Restore state;
4. else (if the node has not timed out in the Restore state), keeping the machine state for the node in the Restore state;

For the Maintain state 504, the protocol steps are:
1. if either (a) the StateTimer has exceeded $P_M$, or (b) the number of valid Sync messages received from other nodes is at least one more than the number of faulty nodes,
   (i) broadcasting a Sync message to all of said other nodes;
   (ii) resetting the StateTimer clock;
   (iii) changing the machine state for the node to the Restore state;
2. else (if neither (a) the StateTimer has exceeded $P_M$, nor (b) the number of valid Sync messages received from other nodes is at least one more than the number of faulty nodes, and (c) the GammaTimer clock has reached the duration of γ),
   (a) if the value of the StateTimer clock equals $\lceil \Delta_{Precision}/\gamma \rceil$, resetting said LocalTimer clock;
   (b) keeping the machine state for the node in the Maintain state;
3. else (if neither (a) the StateTimer has exceeded a predetermined maximum interval, nor (b) the number of valid Sync messages received from other nodes is at least one more than the number of faulty nodes, and (c) the GammaTimer clock has not reached the duration of γ),
   keeping the machine state for the node in the Maintain state.

To avoid introducing oscillations in the system, $P_R$ has to be sufficiently large to allow time to reset the LocalTimer after the node transitions to the Maintain state. In other words, $P_R > \Delta_{Precision} + \text{Latest to Maintain state (LM)} + \Delta_{Precision}$.

If $0 \leq \Delta_{Drift} < D$, $PR > 7F - 1.$

If $\Delta_{Drift} = D$, $PR > 7F + 1.$

If $2D > \Delta_{Drift} > D$, $PR > 7F + 3.$

In general, and for all $F > 0$ and $K \geq 3F + 1$, and to prevent an early timeout, $P_R$ must be constrained in accordance with the previous paragraph. The maximum duration for the Maintain state, $P_M$, is typically much larger than $P_R$. Thus, $P_M$ is derived to be $P_M \geq P_R$.

Since this protocol self-stabilizes from any state, initialization and/or reintegration are not treated as special cases. Therefore, a reintegrating node will always be admitted to participate in the self-stabilization process as soon as it becomes active.

Since $P_{Actual} < P_R + P_M$ and typically $P_M$ is much greater than $P_R$ the maximum convergence time, C, can be approximated to C~P. Therefore, C is a linear function of P, and, similarly, C is a linear function of $P_M$.

A model of this protocol has been mechanically verified using the SMV state machine language where the entire state space is examined, and proven to self-stabilize in the presence of one arbitrary faulty node.

4. Protocol Overhead

Since only one message, namely Sync, is required for the operation of this protocol, therefore, during steady state the protocol overhead is at most (depending on the amount of $\Delta_{Drift}$) two messages per P. Also, since only one message is needed, a single binary value is sufficient to represent it.

5. Applications

The self-stabilizing protocol disclosed herein has many practical applications. Embedded systems, distributed process control, synchronization, inherent fault tolerance which also includes Byzantine agreement, computer networks, the Internet, Internet applications, security, safety, automotive, aircraft, wired and wireless telecommunications, graph theoretic problems, leader election, and time division multiple access (TDMA), are a few examples. These are some of the many areas of distributed systems that can use self-stabilization in order to design more robust distributed systems.

6. Achieving Tighter Precision

Since the time-driven self-stabilization activities take place at γ intervals, if γ, and hence $\Delta_{Precision}$, are larger than the desired precision, the system is said to be coarsely synchronized. Otherwise, the system is said to be finely synchronized. If the granularity provided by the self-stabilization precision is coarser than desired, a higher synchronization precision can be achieved in a two step process. First, a system from any initial state has to be coarsely synchronized and guaranteed that the system remains coarsely synchronized and operates within a known precision, $\Delta_{Precision}$. The second step, in conjunction with the coarse synchronization protocol, is to utilize a proven protocol that is based on the initial synchrony assumptions to achieve optimum precision of the synchronized system as depicted in FIG. 6.

Figure 6:
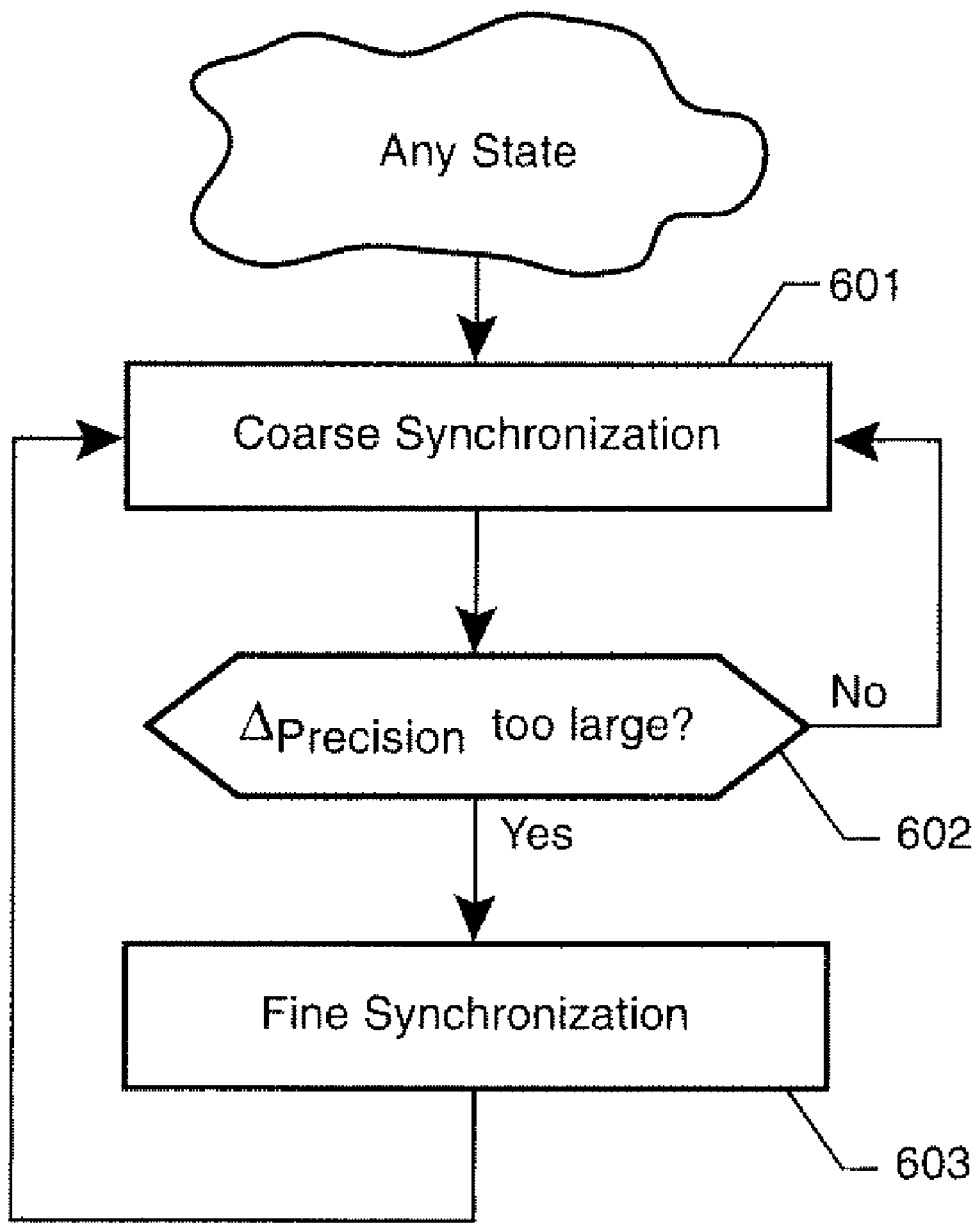
FIG. 6 is a flow chart showing the interaction of coarse and fine level protocols in another embodiment of the invention.

As depicted in FIG. 6, the coarse synchronization protocol 601 initiates the start of the fine synchronization protocol 603 if a tighter precision of the system is desired (602). The coarse synchronization protocol maintains self-stabilization of the system while the fine synchronization protocol increases the precision of the system.

The necessary conditions to initiate the fine synchronization protocol are that convergence has to be achieved and all good nodes have to be in the Maintain state. It follows from Theorem Congruence that upon convergence all good nodes are in the Maintain state. Thus, examination of the current state as well as the value of the StateTimer of the good nodes provides the necessary conditions to attempt to initiate the fine synchronization protocol.

It is apparent, based on the foregoing, that the invention meets the objectives set forth above. Although the invention has been described in detail, it should be understood that various changes, substitutions, and alterations may be readily ascertainable by those skilled in the art and may be made herein without departing from the spirit and scope of the present invention as defined by the claims appended hereto.

The following table lists the symbols used in the protocol.

| Symbols | Description |
| --- | --- |
| $\rho$ | bounded drift rate with respect to real time |
| d | network imprecision |
| D | event-response delay |
| F | maximum number of faulty nodes |
| G | minimum number of good nodes |
| K | sum of all nodes |
| $K_G$ | set of all good nodes |
| Sync | self-stabilization message |
| S | abbreviation for Sync message |
| $\Delta_{SS}$ | time difference between the last consecutive Sync messages |
| $T_R$ | threshold for Retry( ) function |
| Restore | self-stabilization state |
| Maintain | self-stabilization state |
| R | abbreviation for Restore state |
| M | abbreviation for Maintain state |
| $P_R$ | maximum duration while in the Restore state |
| $P_{R, min}$ | minimum value of $P_R$ |
| $P_M$ | maximum duration while in the Maintain state |
| $P_{Actual}$ | effective synchronization period |
| $\gamma$ | equal space time intervals for time-driven activities |
| C | maximum convergence time |
| $\Delta_{LocalTimer}(t)$ | maximum time difference of LocalTimers of any two good nodes at real time t |
| LM | Latest Maintain |
| EM | Earliest Maintain |
| $\Delta_{LMEM}$ | difference of LM and EM, initial self-stabilization precision |
| $\Delta_{Precision}$ | maximum self-stabilization precision |
| $\Delta_{Drift}$ | maximum deviation from the initial synchrony |
| $N_i$ | the $i^{th}$ node |
| $M_i$ | the $i^{th}$ monitor of a node |

What is claimed as new and desired to be secured by Letters Patent of the United States is:

1. A method for synchronizing clocks among a plurality of nodes in a system, the plurality of nodes comprising faulty nodes and good nodes having an arbitrary state and in the presence of a bounded number of arbitrary faults, said nodes being capable of communicating with each other by exchanging messages through a set of communication channels, comprising performing the following steps at each node:
   (1.1) providing a local oscillator clock which provides a local oscillator clock tick;
   (1.2) executing once every local oscillator clock tick (a) a plurality of operational steps for each of a set of monitors comprising one monitor for and corresponding to each other node in said plurality of nodes, and (b) a plurality of protocol steps for a state machine for each node, wherein the state machine comprises a Restore state and a Maintain state;
   (1.3) providing a GammaTimer clock and incrementing said GammaTimer clock once per local oscillator clock tick;
   (1.4) providing a StateTimer clock, and incrementing said StateTimer clock on each equally spaced interval $\gamma$ comprising one or more local oscillator clock ticks such that $\gamma$ is equal to or greater than the sum of a minimum event response delay D among said plurality of nodes and a network imprecision d; and
   (1.5) providing a LocalTimer clock, and incrementing said LocalTimer clock on the local oscillator clock tick.

2. The method of claim 1, wherein said plurality of operational steps for a particular monitor of said set of monitors comprises:
   (2.1) determining if upon the local oscillator clock tick there is an incoming message from the node corresponding to said particular monitor;
   (2.2) if there is such an incoming message,
      (2.2.1) determining if said message is a valid Sync message, wherein said message is considered valid if the time between its arrival and the arrival of a prior Sync message is equal to or greater than an interval regarded as the shortest permissible interval between any two consecutive Sync messages;
      (2.2.2) if said message is a valid Sync message, validating and storing said message; and
      (2.2.3) if said message is not a valid Sync message, invalidating said message;
   (2.3) otherwise, if there is no message, doing nothing.

3. The method of claim 2, wherein said steps of said state machine comprises determining the state machine for the node.

4. The method of claim 3, wherein:
   (4.1) if the state machine is in the Restore state,
      (4.1.1) determining if the node has timed out in the Restore state by exceeding a limit time duration that has been selected for the Restore state;
      (4.1.2) if the node has timed out in the Restore state,
         (4.1.2.1) resetting the StateTimer; and
         (4.1.2.2) changing the state machine for the node to the Maintain state;
      (4.1.3) if the node has not timed out in the Restore state,
         (4.1.3.1) determining if transitory conditions are met, said transitory conditions comprising the conditions that (a) the node has remained in the Restore state, since last entering that state, for a period equal to or greater than two StateTimer ticks when a number of said faulty nodes is zero, or two times the number of faulty nodes, when the number of said faulty nodes is greater than zero, and (b) a period of at least one $\gamma$ has passed since the arrival of the last valid Sync message;
         (4.1.3.2) if the transitory conditions are met, resetting the StateTimer, and changing the state machine for the node to the Maintain state;
         (4.1.3.3) if the transitory conditions are not met, keeping the state machine for the node in the Restore state;
      (4.1.4) if the node has not timed out in the Restore state,
         (4.1.4.1) keeping the state machine for the node in the Restore state;
   (4.2) if the state machine is in the Maintain state,
      (4.2.1) determining if either (a) the StateTimer has timed out by exceeding a limit time duration selected for the Maintain state, or (b) the number of valid Sync messages received from other nodes is at least one more than the number of faulty nodes,
      (4.2.2) if either (a) the StateTimer has timed out, or (b) the number of valid Sync messages received from other nodes is at least one more than the number of faulty nodes,
         (4.2.2.1) broadcasting a Sync message to all of said other nodes;
         (4.2.2.2) resetting said StateTimer clock; and
         (4.2.4.3) changing the state machine for the node to the Restore state;
      (4.2.3) if neither (a) the StateTimer has timed out, nor (b) the number of valid Sync messages received from other nodes is at least one more than the number of faulty nodes, but if the GammaTimer clock has reached the duration of $\gamma$, (4.2.3.1) determining if the value of the StateTimer clock is equal to or greater than the next higher integer value of the quotient of an upper bound on the maximum separation between the LocalTimer clocks of any two good nodes, divided by $\gamma$;

(4.2.3.2) if the value of the StateTimer clock is equal to or greater than said next higher integer value, resetting said LocalTimer clock;

(4.2.3.3) keeping the state machine for the node in the Maintain state;

(4.2.4) if neither (a) the StateTimer has timed out, nor (b) the number of valid Sync messages received from other nodes is at least one more than the number of faulty nodes, and (c) the GammaTimer clock has not reached the duration of $\gamma$, (4.2.4.1) keeping the state machine for the node in the Maintain state.

5. The method of claim 4, wherein said limit time duration for the Restore state, $P_R$, is chosen such that (a) if $0 \leq \Delta_{Drift} < D$, then $P_R > 7F-1$, (b) if $\Delta_{Drift} = D$, then $P_R > 7F+1$, and (e) if $2D > \Delta_{Drift} > D$, then $P_R > 7F+3$, where F is the number of faulty nodes, $\Delta_{Drift}$, a maximum deviation from the initial synchrony, is $((1+\rho)-1/(1+\rho))P \cdot \gamma$, $\rho$ is a drift rate ($0 \leq \rho \ll 1$) of the local oscillator clock, and P, an effective synchronization period, is a time interval between the last two consecutive resets of the LocalTimer, measured at a steady state when said system is stabilized.

6. The method of claim 5, wherein an interval regarded as the shortest permissible interval between any two consecutive Sync messages, $\Delta_{SS,min}$, is $(TD_{min} \cdot +1)$, where $TD_{min}$ is 2 for cases when the number of faulty nodes is zero, otherwise $TD_{min}$ is equal to two times the number of faulty nodes when the number of faulty nodes is greater than zero.

7. The method of claim 5, wherein said method requires only one message, which message is Sync.

8. The method of claim 5, wherein a synchronization precision, $\Delta_{Precision}$, comprising the upper bound on the maximum separation between the LocalTimers of any two good nodes, equals $(3F-1) \cdot \gamma - D + \Delta_{Drift}$.

9. The method of claim 8, wherein a bound on the maximum convergence time, C, equals $(2P_R+P_M) \cdot \gamma$ wherein $P_M$ is a maximum duration for the Maintain state.

10. The method of claim 9, wherein the P, is a maximum time interval between two consecutive resets of the Local-Timer by a good node, and is equal to $P_R+P_M$ during said steady state.

11. The method of claim 10, wherein upon reaching said steady state when said system is stabilized, the following properties are obtained: (a) convergence, wherein for all values of t greater than or equal to C, the maximum difference of values of the LocalTimers of all good nodes in said plurality of nodes. $\Delta_{LocalTimer}(t)$, is less than or equal to $\Delta_{Precision}$, (b) closure, wherein for all values of t greater than C it remains true that $\Delta_{LocalTimer}(t)$ is less than or equal to $\Delta_{Precision}$, and (c) congruence, wherein for all said good nodes, and for all values of t greater than C, the condition that LocalTimer(t)=0 for any such good node implies that all of said good nodes are in the Maintain state.

12. The method of claim 5, wherein said limit me duration for the Maintain state is chosen to be a value greater than the limit time duration for the Restore state.

13. The method of claim 5, further comprising determining if all good nodes are in the Maintain state by examining the current state of said good nodes and the StateTimer value of said good nodes, and if all good nodes are in the Maintain state, performing a fine synchronization by reducing the upper bound on the maximum separation between the Local-Timer clocks of any two good nodes.

14. The method of claim 1, wherein said system does not comprise a central clock used by said nodes for synchronization.

15. The method of claim 1, wherein said nodes do not use an externally generated global pulse.

16. A clock synchronization control element for a node within a plurality of nodes in a system comprising faulty nodes and good nodes, having an arbitrary state and in the presence of a bounded number of arbitrary faults, said nodes being capable of communicating with each other by exchanging messages through a set of communication channels, comprising:

(16.1) a local oscillator clock having a local oscillator clock tick;

(16.2) a set of monitors comprising one monitor for and corresponding to each other node in said plurality of nodes, and a state machine for the node, having a Restore state and a Maintain state, said monitors and said state machine each being executed on each tick of said local oscillator clock;

(16.3) a StateTimer clock, incremented on each equally spaced interval $\gamma$ comprising one or more local oscillator clock ticks such that $\gamma$ is equal to or greater than the sum of a minimum event response delay D among said plurality of nodes and a network imprecision d;

(16.4) a LocalTimer clock, incremented on every local oscillator clock tick; and (16.5) a GammaTimer clock, incremented once per local oscillator clock tick.

17. The control element in accordance with claim 16, wherein a monitor in the set of monitors comprises logic to determine if upon the local oscillator clock tick there is an incoming message from the node corresponding to said monitor, and if there is an incoming message, to determine if said incoming message is a valid Sync message by testing if a time comprising the difference between an arrival time and an arrival time of a prior Sync message is equal to or greater than an interval regarded as the shortest permissible interval between any two consecutive Sync messages, and if said incoming message is a valid Sync message, to validate and store said incoming message, and if said incoming message is not a valid Sync message, to invalidate said incoming message, and otherwise, if there is no incoming message, to do nothing.

18. The control element in accordance with claim 16, wherein said state machine comprises logic to determine a state of the state machine for the node.

19. The control element in accordance with claim 18, wherein said state machine comprises logic executable in said Restore state to determine if the node has timed out in the Restore state by testing whether said node has been in the Restore state for more than a selected limit time duration for the Restore state, and if the node has timed out in the Restore state, to reset the StateTimer, and change the state machine for the node to the Maintain state, and if the node has not timed out in the Restore state, determining if transitory conditions are met, said transitory conditions comprising that (a) the node has remained in the Restore state, since last entering that state, for a period equal to or greater than two StateTimer ticks, when the number of said faulty nodes is zero, or two times the number of faulty nodes, when the number of said faulty nodes is greater than zero, and (b) a period of at least one $\gamma$ has passed since an arrival of a last valid Sync message, and if the transitory conditions are met, to reset the StateTimer, and change the state machine for the node to the Maintain state, and, if the transitory conditions are not met, to keep the state machine for the node in the Restore state, and otherwise, if the node has not timed out in the Restore state, to keeping the state machine for the node in the Restore state.

20. The control element in accordance with claim 19, wherein said state machine comprises logic executable in said Maintain state to determine if either (a) the StateTimer has exceeded a predetermined maximum interval, or (b) a number of valid Sync messages received from other nodes is at least one more than the number of faulty nodes, and either (a) the StateTimer has exceeded a predetermined maximum interval, or (b) the number of valid Sync messages received from other nodes is at least one more than the number of faulty nodes, to broadcast a Sync message to all of said other nodes, reset said StateTimer clock, and change the state machine for the node to the Restore state, and if neither (a) the StateTimer has exceeded a predetermined maximum interval, nor (b) the number of valid Sync messages received from other nodes is at least one more than the number of faulty nodes, but if the GammaTimer clock has reached the duration of $\gamma$, to determine if the value of the StateTimer clock is equal to or greater than the next higher integer value of the of an upper bound on the maximum separation between the LocalTimer clocks of any two good nodes, divided by $\gamma$, and if the value of the StateTimer clock is equal to or greater than said next higher integer value, to reset said LocalTimer clock, to keep the state machine for the node in the Maintain state, and otherwise, if neither (a) the StateTimer has exceeded the predetermined maximum interval, nor (b) the number of valid Sync messages received from other nodes is at least one more than the number of faulty nodes, and (c) the GammaTimer clock has not reached the duration of $\gamma$, to keep the state machine for the node in the Maintain state.

21. The control element in accordance with claim 20, wherein said limit time duration for the Restore state, $P_R$, is chosen such that (a) if $0 \leq \Delta_{Drift} < D$, then $P_R > 7F-1$, (b) if $\Delta_{Drift} = D$, then $P_R > 7F+1$, and (c) if $2D > \Delta_{Drift} > D$, then $P_R > 7F+3$, where F is the number of faulty nodes, $\Delta_{Drift}$, a maximum deviation from the initial synchrony, is $((1+\rho)-1/(1+\rho))P \cdot \gamma$, $\rho$ is a drift rate ($0 \leq \rho \ll 1$) of the local oscillator clock, and P, an effective synchronization period, is a time interval between the last two consecutive resets of the LocalTimer, measured at a steady state when said system is stabilized.

22. The control element in accordance with claim 20, wherein an interval regarded as the shortest permissible interval between any two consecutive Sync messages, $\Delta_{SS,min}$, is $(TD_{min} \cdot \gamma + 1)$, where $TD_{min}$ is 2 for cases when the number of faulty nodes is zero, and otherwise $TD_{min}$ is equal to two times the number of faulty nodes when the number of faulty nodes is greater than zero.

23. The control element in accordance with claim 20 wherein said node requires only one message, which message is Sync.

24. The control element in accordance with claim 20, wherein a synchronization precision, $\Delta_{Precision}$, which is the upper bound on the maximum separation between the LocalTimers of any two good nodes, equals $(3F-1) \cdot \gamma - D + \Delta_{Drift}$.

25. The control element in accordance with claim 24, wherein a bound on the maximum convergence time, C, equals $(2P_R + P_M) \cdot \gamma$ wherein $P_M$ is a maximum duration for the Maintain state.

26. The control element in accordance with claim 25, wherein the P is a maximum time interval between two consecutive resets of the LocalTimer by a good node, and is equal to $P_R + P_M$ during said steady state.

27. The control element in accordance with claim 16, wherein said system does not comprise a central clock used by said nodes for synchronization.

28. The control element in accordance with claim 16, wherein said nodes do not use an externally generated global pulse.

29. The control element in accordance with claim 26, wherein upon reaching said steady state when said system is stabilized, the following properties are obtained: (a) convergence, wherein for all values of t greater than or equal to C, a maximum difference of values of the local timers of any good node in said plurality of nodes, $\Delta_{LocalTimer}(t)$, is less than or equal to $\Delta_{Precision}$, (b) closure, wherein for all values of t greater than C it remains true that $\Delta_{LocalTimer}(t)$ is less than or equal to $\Delta_{Precision}$, and (c) congruence, wherein for all said good nodes, and for all values of t greater than C, the condition that LocalTimer(t)=0 for any such good node implies that all of said good, nodes are in the Maintain state.

30. The control element in accordance with claim 20, wherein said predetermined maximum interval for said Maintain state is chosen to be a value greater than the limit time duration for the Restore state.

31. The control element in accordance with claim 20, comprising logic to determine if all good nodes are in the Maintain state by examining the current state of said node and the StateTimer value of said good nodes, and if all good nodes are in the Maintain state, to perforin a fine synchronization by reducing the upper bound on the maximum separation between the LocalTimer clocks of any two good nodes.

32. A clock synchronization control element for a node within a plurality of nodes in a system, having an arbitrary state and in the presence of a bounded number of arbitrary faults, said nodes being capable of communicating with each other by exchanging messages through a set of communication channels and said nodes comprising good nodes and faulty nodes, comprising:
(32.1) a local oscillator clock having a local oscillator clock tick;
(32.2) a set of monitors comprising one monitor for and corresponding to each other node in said plurality of nodes, and a state machine for the node, having a Restore state and a Maintain state, said monitors and said state machine each being executed on each tick of said local oscillator clock;
(32.3) a StateTimer clock, incremented on each equally spaced interval $\gamma$ comprising one or more local oscillator clock ticks such that $\gamma$ is equal to or greater than the sum of the minimum event response delay D among said plurality of nodes and the network imprecision d;
(32.4) a LocalTimer clock, incremented on every local oscillator clock tick;
(32.5) a GammaTimer clock and incrementing said GammaTimer clock once per local oscillator clock tick;
(32.6) a monitor in the set of monitors comprising logic to determine if upon the local oscillator clock tick there is an incoming message from the node corresponding to said monitor, and if there is an incoming message, to determine if said incoming message is a valid Sync message by testing if a time between an arrival time and an arrival time of a prior Sync message is equal to or greater than an interval comprising a shortest permissible interval between any two consecutive Sync messages, and if said incoming message is a valid Sync message, to validate and store said incoming message, and if said incoming message is not a valid Sync message, to invalidate said incoming message, and otherwise, if there is no such incoming message, to do nothing;

(32.7) said state machine comprising:
  (32.7.1) logic to determine a state of the state machine for the node;
  (32.7.2) logic executable in said Restore state to determine if the node has timed out in the Restore state by testing whether said node has been in the Restore state for more than a selected limit time duration for the Restore state, and if the node has timed out in the Restore state, to reset the StateTimer, and change the state machine for the node to the Maintain state, and if the node has not timed out in the Restore state, determining if transitory conditions are met, said transitory conditions comprising that (a) the node has remained in the Restore state, since last entering that state, for a period equal to or greater than two StateTimer ticks when a number of said faulty nodes is zero, or two times the number of faulty nodes, when the number of said faulty nodes is greater than zero, and (b) a period of at least one γ has passed since the arrival of the last valid Sync message, and if the transitory conditions are met, to reset the StateTimer, and change the state machine for the node to the Maintain state, and, if the transitory conditions are not met, to keep the state machine for the node in the Restore state, and otherwise, if the node has not timed out in the Restore state, to keeping the state machine for the node in the Restore state;
  (32.7.3) logic executable in said Maintain state to determine if either (a) the StateTimer has exceeded a predetermined maximum interval, or (b) the number of valid Sync messages received from other nodes is at least one more than the number of faulty nodes, and either (a) the StateTimer has exceeded the predetermined maximum interval, or (b) the number of valid Sync messages received from other nodes is at least one more than the number of faulty nodes, to broadcast a Sync message to all of said other nodes, reset said StateTimer clock, and change the state machine for the node to the Restore state, and if neither (a) the StateTimer has exceeded the predetermined maximum interval, nor (b) the number of valid Sync messages received from other nodes is at least one more than the number of faulty nodes, but if the GammaTimer clock has reached the duration of γ, to determine if the value of the StateTimer clock is equal to or greater than a next higher integer value of the of upper bound on the maximum separation between the LocalTimer clocks of any two good nodes, divided by γ, and if the value of the StateTimer clock is equal to or greater than said next higher integer value, to reset said LocalTimer clock, to keep the state machine for the node in the Maintain state, and otherwise, if neither (a) the StateTimer has exceeded the predetermined maximum interval, nor (b) the number of valid Sync messages received from other nodes is at least one more than the number of faulty nodes, and (c) the GammaTimer clock has not reached the duration of γ, to keep the state machine for the node in the Maintain state;

(32.8) wherein said limit time duration for the Restore state, $P_R$, is chosen such that (a) if $0 \leq \Delta_{Drift} < D$, then $P_R > 7F-1$, (b) if $\Delta_{Drift} = D$, then $P_R > 7F+1$, and (c) if $2D > \Delta_{Drift} > D$, then $P_R > 7F+3$, where F is the number of faulty nodes, $\Delta_{Drift}$, a maximum deviation from the initial synchrony, is $((1+\rho)-1/(1+\rho))P \cdot \gamma$, $\rho$ is the drift rate ($0 \leq \rho \ll 1$) of the local oscillator clock, and P an effective synchronization period, is a time interval between the last two consecutive resets of the LocalTimer, measured at the steady state when said system is stabilized;

(32.9) wherein an interval regarded as the shortest permissible interval between any two consecutive Sync messages, $\Delta_{SS,min}$, is $(TD_{min}\gamma+1)$, where $TD_{min}$ is 2 for cases when the number of faulty nodes is zero, and otherwise $TD_{min}$ is equal to two times the number of faulty nodes when the number of faulty nodes is greater than zero;

(32.10) wherein said node requires only one message, which message is Sync;

(32.11) wherein the synchronization precision, $\Delta_{Precision}$, which is the upper bound on the maximum separation between the LocalTimers of any two good nodes, equals $(3F-1) \cdot \gamma - D + \Delta_{Drift}$;

(32.12) wherein a bound on the maximum convergence time, C, equals $(2P_R+P_M) \cdot \gamma$ wherein $P_M$ is a maximum duration for the Maintain state;

(32.13) wherein P, is a maximum time interval (during steady state) between two consecutive resets of the LocalTimer by a good node, and is equal to $P_R+P_M$;

(32.14) wherein said system does not comprise a central clock used by said nodes for synchronization;

(32.15) wherein said nodes do not use an externally generated global pulse; and (32.16) such that, upon reaching said steady state when said system is stabilized, the following properties are obtained: (a) convergence, wherein after all times for all values of t greater than or equal to C, the maximum difference of values of the local timers of any good node in said plurality of nodes, $\Delta_{LocalTimer}(t)$, is less than or equal to $\Delta_{Precision}$, (b) closure, wherein for all values of t greater than C it remains true that $\Delta_{LocalTimer}(t)$ is less than or equal to $\Delta_{Precision}$, and (c) congruence, wherein for all said good nodes, and for all values of t greater than C, the condition that LocalTimer(t)=0 for any such good node implies that all of said good nodes are in the Maintain state.

33. A node in accordance with claim 32, wherein said predetermined maximum interval for said Maintain state is chosen to be a value greater than the limit time duration for the Restore state.

34. A node in accordance with claim 32, further comprising logic to determine if all good nodes are in the Maintain state by examining the current state of said node and the StateTimer value of said good nodes, and if all good nodes are in the Maintain state, to perform a fine synchronization by reducing the upper bound on the maximum separation between the LocalTimer clocks of any two good nodes.

* * * * *